United States Patent [19]
Krempl et al.

[11] Patent Number: 5,440,188
[45] Date of Patent: Aug. 8, 1995

[54] PIEZOELECTRIC CRYSTAL ELEMENT

[75] Inventors: Peter W. Krempl, Graz/Ragnitz; Wolfgang Wallnöfer, Graz, both of Austria

[73] Assignee: AVL Gesellschaft für Verbrennungskraftmaschinen und Messtechnik mbH Prof. Dr.Dr.h.c.Hans List, Graz, Austria

[21] Appl. No.: 276,353

[22] Filed: Jul. 15, 1994

[30] Foreign Application Priority Data

Jul. 20, 1993 [AT] Austria ................................ 1442/93
Aug. 5, 1993 [AT] Austria ................................ 1564/93

[51] Int. Cl.$^6$ ............................................. H01L 41/04
[52] U.S. Cl. ............................ 310/313 A; 310/313 R; 310/313 D; 310/361
[58] Field of Search .......... 310/313 R, 313 A, 313 D, 310/361

[56] References Cited

U.S. PATENT DOCUMENTS

| | | | |
|---|---|---|---|
| 4,109,172 | 8/1978 | O'Connell | 310/313 |
| 4,172,906 | 10/1979 | Pancholy | 427/82 |
| 4,324,773 | 4/1982 | Chai et al. | 423/311 |
| 4,382,840 | 5/1983 | Chai et al. | 156/623 R |
| 4,609,843 | 9/1986 | Cann et al. | 310/313 A |
| 4,992,694 | 2/1991 | Günter et al. | 310/360 |
| 5,151,110 | 9/1992 | Bein et al. | 55/25 |
| 5,369,327 | 11/1994 | Wallnöfer et al. | 310/313 A |

FOREIGN PATENT DOCUMENTS 0138914 10/1980 Japan ................................ 310/361

Primary Examiner—Thomas M. Dougherty
Attorney, Agent, or Firm—Watson, Cole, Grindl & Watson

[57] ABSTRACT

A piezoelectric crystal element for surface acoustic wave applications with a quartz substrate with at least one substantially planar quartz surface, the planar quartz surface having an epitaxially grown layer of a quartz-isomorphous crystal with the total molecular formula $ABO_4$, A standing for Al or Ga, and B for P or As, and the quartz surface and the epitaxial layer having approximately the same crystallographic orientation.

16 Claims, 2 Drawing Sheets

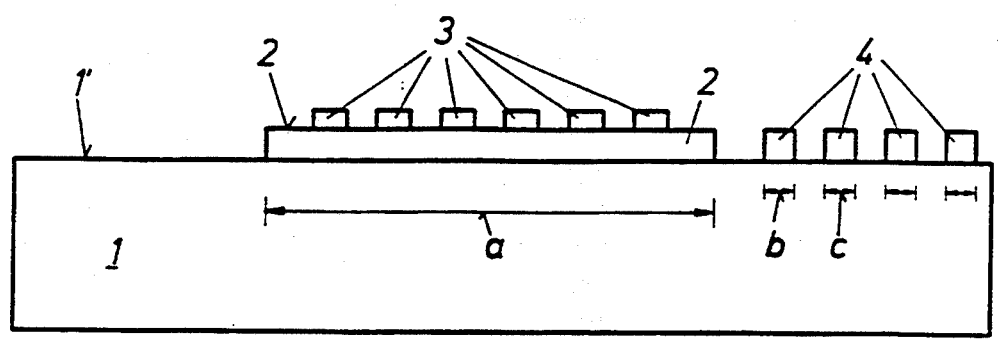
_Fig. 4_
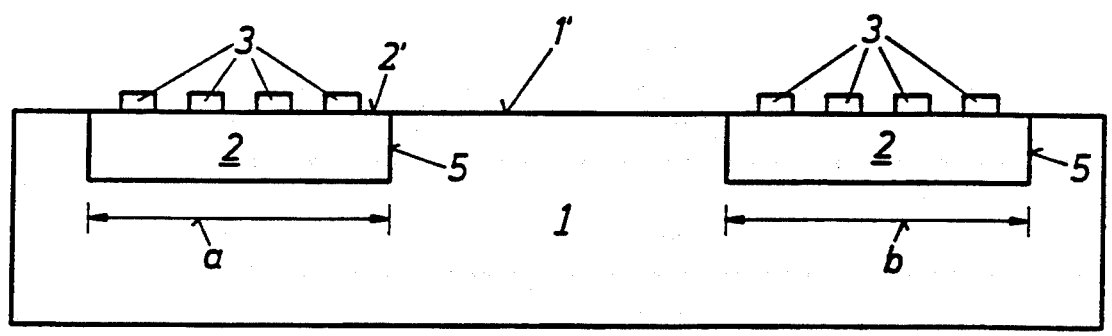
_Fig. 5_
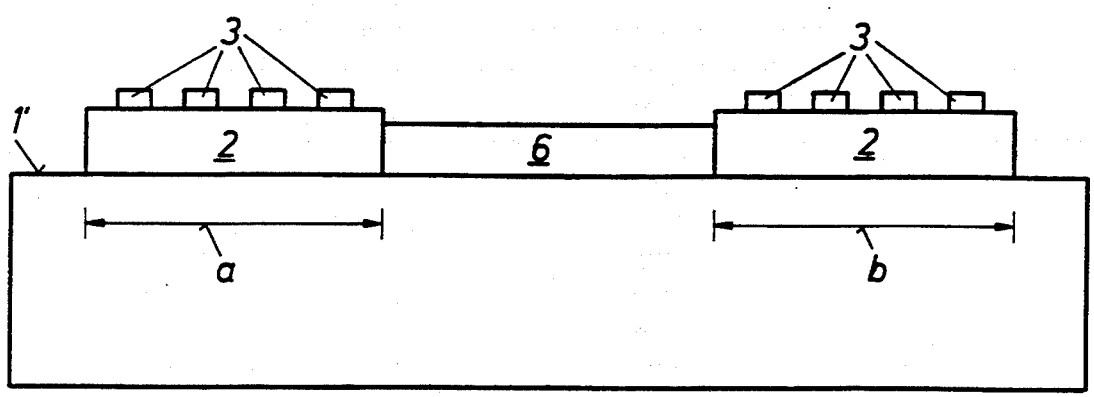
_Fig. 6_

PIEZOELECTRIC CRYSTAL ELEMENT

BACKGROUND OF THE INVENTION

The invention relates to a piezoelectric crystal element for surface acoustic wave applications, with a quartz substrate with at least one substantially planar quartz surface.

In signal processing and sensor applications in the range of 30 MHz to 30 GHz surface acoustic waves (SAW) are increasingly used. These applications of surface technology offer a broad variety of possibilities for signal excitation and processing.

Main criteria for a substrate for SAW components are strong electromechanical coupling and good temperature stability of propagation time. A combination of the two is hardly found in the prior art, however.

DESCRIPTION OF THE PRIOR ART

Usually a monolithic piezoelectric crystal is used as a substrate. Quartz offers a temperature-compensated cut, but weak coupling, whereas lithium niobate and lithium tantalate are characterized by stronger temperature dependences. Other materials meeting both criteria simultaneously are being tested; because of the complex and expensive process of crystal growth they cannot yet be obtained at a competitive price in large quantities. These materials include the quartz isomorphs $AlPO_4$ (berlinite) and $GaPO_4$.

As the waves penetrate into the substrate only to a depth of a few wavelengths they are strongly influenced by thin layers on the surface. In the known devices either a piezoelectric layer is applied onto a non-piezoelectric substrate to permit wave excitation, as in the instance of Zno films on glass (O. YAMAZAKI et al., IEEE Trans. SU-27, 1976, 724) or silicon (F. S. Hickernell et al., IEEE Ultrasonics Symp. 1980, 104), or a dielectric film is used to compensate temperature dependence, as in the instance of amorphous $SiO_2$ on lithium tantalate (T. E. PARKER and H. WICHANSKY, J. Appl. Phys. 50 (1979), 1360).

SUMMARY OF THE INVENTION

It is an object of the invention to find a piezoelectric crystal element with strong electromechanical coupling and good temperature stability which may be efficiently produced at comparatively low cost.

In the invention this object is achieved by providing that the planar quartz surface have an epitaxially grown layer of a quartz-isomorphous crystal with the total molecular formula $ABO_4$, A standing for Al or Ga, and B for P or As, and by providing that the quartz surface and the epitaxial layer have approximately the same crystallographic orientation.

It has been found unexpectedly, for instance, that with certain crystallographic orientations a very thin epitaxial layer of $GaPO_4$ on a quartz plate will suffice to obtain piezoelectric components whose properties are significantly better than those of quartz, i.e., good temperature stability combined with strong electro-acoustic coupling. In the invention the positive effect of the $GAPO_4$ layer is noticeable even if the thickness of the layer is only 0.1 to 200 micrometers, or rather, a quarter of the surface wavelength.

For orientations in which the crystallographic X-axis is normal to the sagittal plane, i.e., so-called X-cylinder cuts, where the surface waves in quartz isomorphs are of a purely transversal character, it has been found surprisingly that coupling in layered structures is indeed much higher than in elements of pure quartz or $GaPO_4$.

As the layer to be grown on a suitable quartz plate need not be thicker than a few micrometers, the time required for growth is drastically reduced, which will permit a very efficient production of components and a most economical use of the precious raw materials, in particular gallium.

Due to the progress that has been made in quartz growing, wafers of a three-inch diameter are obtainable as seeds. Their use will permit simultaneous preparation of numerous components, the epitaxial layer being deposited by hydrothermal growth or sputtering.

A preferred variant of the invention provides that the epitaxial layer cover only parts of the quartz surface. In some variants requiring both increased coupling in the area of the transducers and low wave attenuation due to the epitaxially deposited substrate, it is an advantage if the epitaxial layer is deposited only in the immediate vicinity of the electrode structures.

The epitaxial layer may be deposited by hydrothermal growth, or by vapor-phase deposition, such as chemical (CVD, plasma-activated CVD) or physical vapor deposition (sputtering, evaporation coating, ionic plating).

In resonator applications the edge of the epitaxial layer may be used for SAW reflections. According to the invention it may be an advantage if strip-like regions with an additional epitaxial layer are provided on the quartz surface, which are designed to reflect the surface waves.

In further development of the invention the proposal is put forward that the epitaxial layer be deposited in recesses of the quartz surface. By sinking the layer into the quartz substrate any reflections which are unwanted in this case are reduced. In this manner strong coupling of the epitaxial layer is combined with the low surface wave attenuation of quartz.

It is finally provided by the invention that between at least two parts of the quartz surface coated with an epitaxial layer a sensitive layer be provided which should cover the space in between at least partially, the phase velocity of the surface acoustic wave changing under the influence of a measurement variable, say, $NO_2$ concentration. In an example cited in M. RAPF et al., Sensors and Actuators B, 4 (1991), 103-108, phthalocyanine is used for the layer.

If the epitaxial layer is desirable only in certain areas of the quartz surface, the remaining parts may be masked during deposition, or the layer is partially removed by etching techniques afterwards.

It is further proposed by the invention that electrode structures be provided on the surface of the epitaxial layer for the purpose of exciting, influencing and/or receiving acoustic waves propagating parallel to the surface. For example, transducers, reflectors and other structures may be applied photolithographically with the usual techniques.

In another preferred application of a piezoelectric crystal element of the invention as an opto-acoustic component the epitaxial layer serves as a waveguide for light.

BRIEF DESCRIPTION OF THE DRAWINGS

The invention will be further described with reference to the accompanying drawings, in which FIG. 4 shows a section of another piezoelectric crystal element of the invention, and FIGS. 5 and 6 show variants of the crystal element of FIG. 4.

DETAILED DESCRIPTION OF PREFERRED EMBODIMENTS

On a substrate of quartz 1, i.e., on a substantially planar quartz surface 1', an epitaxially grown layer 2 of approximately the same orientation as the quartz surface 1' is provided, which is made From a quartz-isomorphous crystal, e.g., a GaPO4 layer. On the surface 2' of layer 2 interdigital transducers 3 are applied photolithographically, or other structures used for exciting or influencing surface acoustic waves. Wave propagation takes place parallel to the surface 1' in layer 2 and in the uppermost part of the quartz crystal 1.

Figure 1:
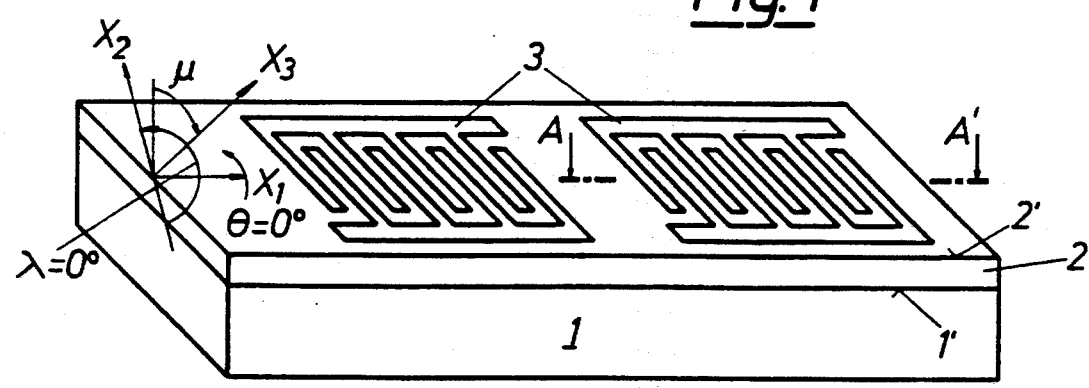
FIGS. 1 and 2 show piezoelectric crystal elements of the invention, with different crystallographic orientations, FIG. 3 gives a section (A-A') through the crystal element of FIG. 1 or 2.
Figure 2:
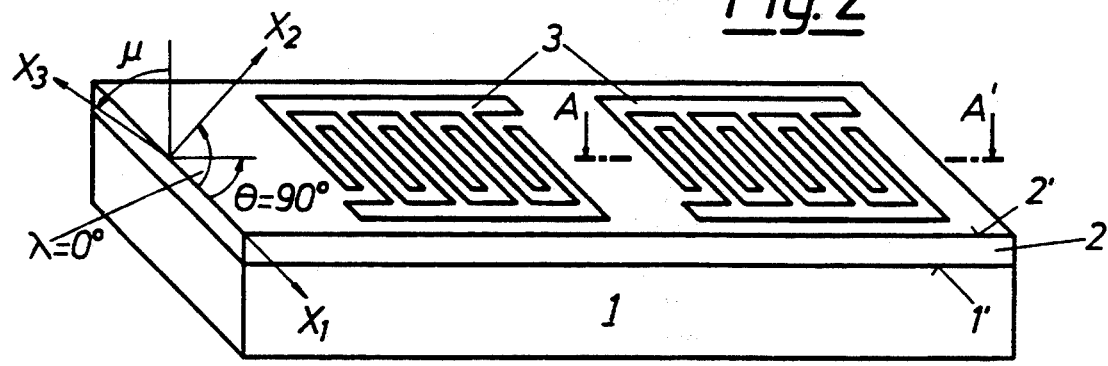
Figure 3:
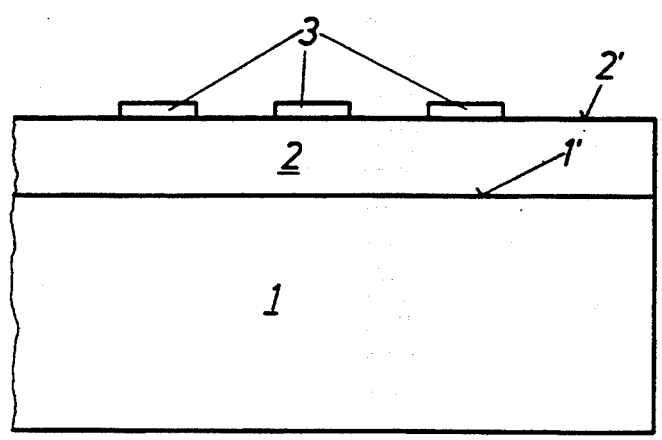

The optimum crystallographic orientations for a layered structure comprising the quartz crystal 1 and the epitaxial layer 2 are not identical with those for a single crystal of the layered or substrate material. Because of the dispersion of the surface waves they also depend on the ratio between layer thickness and wavelength. For this reason only a few ranges of orientation can be specified for any given material combination. It has been found that for a GaPO4 layer on quartz strong electromechanical coupling and satisfactory temperature compensation of propagation time or frequency are obtained in the Following angular ranges:

Optimum orientations are obtained if the coordinate system whose x1 axis points in the direction of the wave vector, and whose x3 axis is normal to the boundary faces of the layer, is derived From the coordinate system under IEEE Standard on Piezoelectricity 176 (1978) by rotation through the following Euler angles: $\lambda$=approx. 0°, $\mu$=50° to 70°, and $\theta$=approx. 0°, or through angles: $\lambda$=approx. 0°, $\mu$=−20° to 0°, and $\theta$=90°. In the first instance the crystallographic X or X1 axis points into the direction of propagation of the wave (X-boule orientations, FIG. 1), in the latter it is normal to the sagittal plane, which is defined by the direction of propagation and surface normal (X-cylinder orientations, FIG. 2).

For AlPO4 (berlinite) on quartz optimum orientations are in the Following ranges: $\lambda$=approx. 0°, $\mu$=65° to 90°, and $\theta$=approx. 0°, or $\lambda$=approx. 0°, $\mu$=−40° to −20° or 40° to 60 °, and $\theta$=approx. 90°.

Since an epitaxial layer 2 of GaPO4 is transparent from the range to far into the infrared range, it can be used to advantage as an optical waveguide. A light wave propagating in the GaPO4 layer 2 almost parallel to the surface 2' is totally reflected both at the surface 2' and at the interface 1' with the quartz 1. The layered structure thus is suitable for use in acoustic components in which light is modulated, diffracted or switched by surface waves.

In a variant according to FIG. 4, a substrate of quartz 1 is provided with an epitaxially grown layer 2 only in a part a of its substantially planar quartz surface 1', which layer 2 has approximately the same orientation as the quartz surface 1' and is made from a quartz-isomorphous crystal, e.g., GaPO4. The surface 2' of the epitaxial layer 2 is provided with photolithographically applied interdigital transducers 3 or other structures used for exciting or influencing surface waves. Wave propagation takes place parallel to the surface 1' in layer 2 and in the uppermost part of the quartz crystal 1.

SAW reflection at the edges of the epitaxial layer 2 and in additional strip-like regions b, c covered with an epitaxial layer 4 may increase the resonator Q in resonator applications.

In the variant of FIG. 5 the epitaxial layer covers parts a and b and is deposited in recesses 5 of the quartz surface 1'. By sinking the layer any reflection which is undesirable in this case is avoided.

In the variant of FIG. 6 the area between the electrode structures 3, which is not covered by an epitaxial layer 2, is coated with a sensitive layer 6 whose SAW parameters change under the influence of a measurement variable, e.g., NO2 concentration.

The crystal element of the invention may be prepared in the following way:

Quartz wafers of a defined orientation are mounted in a growth autoclave. The autoclave is filled with a nutrient solution. By temporal or spatial variation of the temperature an epitaxial GaPO4 layer is deposited on the wafers. This process takes place at high temperatures and pressures. After the solution has been drained the coated quartz plates are removed; the GaPO4 layers are lapped and polished to the desired thickness. With the use of etching or lift-off techniques surface wave structures are formed photolithographically from a thin metal layer. The wafer is then cut into individual elements which are fixed in the housing and contacted.

We claim:

1. Piezoelectric crystal element for surface acoustic wave applications, comprising a quartz substrate having at least one substantially planar quartz surface, wherein said planar quartz surface has an epitaxially grown layer of a quartz-isomorphous crystal with the total molecular formula ABO4, A standing for Al or Ga, and B for P or As, and wherein said quartz surface and said epitaxial layer have approximately the same crystallographic orientation.

2. Piezoelectric crystal element according to claim 1, wherein said epitaxial layer is made from GaPO4, and crystallographic orientation of said epitaxial layer is defined by Euler angles X in the range of 0°, $\mu$ in the range of 50° to 70°, and $\theta$ in the range of 0°.

3. Piezoelectric crystal element according to claim 1, wherein said epitaxial layer is made from GaPO4, and crystallographic orientation of said epitaxial layer is defined by Euler angles $\lambda$ in the range of 0°, $\mu$ in the range of −20° to 0°, and $\theta$ in the range of 90°.

4. Piezoelectric crystal element according to claim 1, wherein said epitaxial layer is made from AlPO4, and crystallographic orientation of said epitaxial layer is defined by Euler angles $\lambda$ in the range of 0°$\mu$ in the range of 65° to 90°, and $\theta$ in the range of 0°.

5. Piezoelectric crystal element according to claim 1, wherein said epitaxial layer is made from AlPO4, and crystallographic orientation of said epitaxial layer is defined by Euler angles $\lambda$ in the range of 0°, $\mu$ in the range of −40° to −20° or 40° to 60°, and $\theta$ in the range of 90°.

6. Piezoelectric crystal element according to claim 1, wherein said epitaxial layer covers only parts of said quartz surface.

7. Piezoelectric crystal element according to claim 6, wherein said epitaxial layer is deposited in recesses of said quartz surface.

8. Piezoelectric element according to claim 6, having striplike regions on said quartz surface, wherein an additional epitaxial layer is provided in said striplike regions, which are designed to reflect surface waves.

9. Piezoelectric crystal element according to claim 6, wherein between at least two of said parts of said quartz surface coated with an epitaxial layer, a sensitive layer is provided which is sensitive for a measurement variable and covers the space between said two parts at least partially, thus changing the phase velocity of surface acoustic waves under the influence of said measurement variable.

10. Piezoelectric crystal element according to claim 9, wherein said measurement variable is $NO_2$ concentration.

11. Piezoelectric crystal element according to claim 6, wherein the thickness of said epitaxial layer is 0.1 to 200 micrometers.

12. Piezoelectric crystal element according to claim 1, wherein the thickness of said epitaxial layer is 0.1 to 200 micrometers.

13. Piezoelectric crystal element according to claim 1, wherein said epitaxial layer is deposited by hydrothermal growth.

14. Piezoelectric crystal element according to claim 1, wherein said epitaxial layer is deposited by a sputtering technique.

15. Piezoelectric crystal element according to claim 1, wherein electrode structures are provided on said surface of said epitaxial layer for the purpose of exciting, influencing and/or receiving acoustic waves propagating parallel to said surface.

16. Use of a piezoelectric crystal element according to claim 1, as an opto-acoustic component, wherein said epitaxial layer serves as a waveguide for light.

* * * * *